(12) United States Patent
BuAbbud et al.

(10) Patent No.: US 6,310,784 B1
(45) Date of Patent: Oct. 30, 2001

(54) DENSELY ARRANGED ELECTRICALLY SHIELDED COMMUNICATION PANELS

(75) Inventors: George H. BuAbbud, South Lake; John W. Matthes, Southlake; Janet A. Bradshaw, Flower Mound; Muneer Zuhdi, Lewisville, all of TX (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/410,975

(22) Filed: Oct. 4, 1999

Related U.S. Application Data
(60) Provisional application No. 60/135,623, filed on May 24, 1999.

(51) Int. Cl.[7] .................................................. H05K 9/00
(52) U.S. Cl. ........................ 361/816; 361/799; 361/800; 361/818; 439/668
(58) Field of Search ..................... 361/788, 799, 361/796, 800, 816, 818; 439/49, 668

(56) References Cited

U.S. PATENT DOCUMENTS

| | | | |
|---|---|---|---|
| 5,001,602 | * 3/1991 | Suffi et al. | 361/390 |
| 5,045,977 | * 9/1991 | Cesar | 361/424 |
| 5,078,624 | * 1/1992 | Burroughs et al. | 439/668 |
| 5,130,986 | 7/1992 | Babb et al. . | |
| 5,159,534 | * 10/1992 | Hudson et al. | 361/391 |
| 5,173,845 | * 12/1992 | Shaw | 361/415 |
| 5,388,995 | * 2/1995 | Rudy, Jr. et al. | 361/730 |
| 5,520,554 | 5/1996 | Henningsson et al. . | |
| 5,546,292 | 8/1996 | Hill et al. . | |
| 5,980,312 | * 11/1999 | Chapman et al. | 439/540.1 |

FOREIGN PATENT DOCUMENTS

| | | |
|---|---|---|
| 8803544 | 7/1988 | (DE) . |
| 412045A2 | 2/1999 | (EP) . |

\* cited by examiner

*Primary Examiner*—Jeffrey Gaffin
*Assistant Examiner*—Tuan Dinh

(57) ABSTRACT

Apparatus and method for supporting a large number of densely arranged and electrically shielded panels are disclosed. To achieve shielding each panel has a grounded back plane which acts as shielding for circuitry on an adjacent panel as well as shielding for its own circuitry.

10 Claims, 3 Drawing Sheets

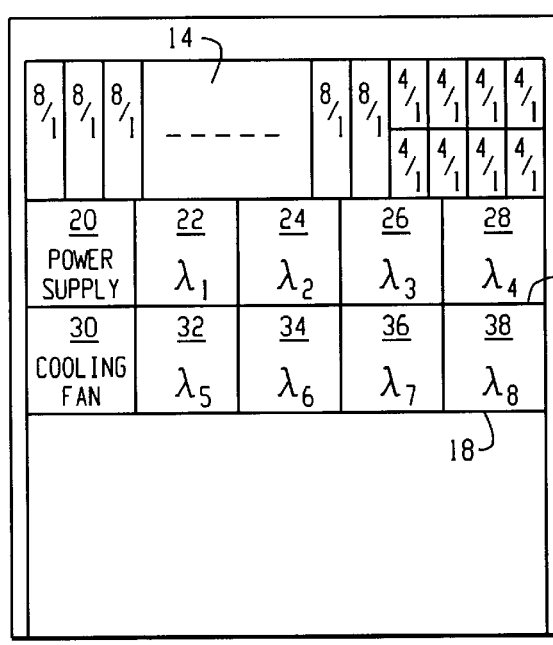
Fig. 1
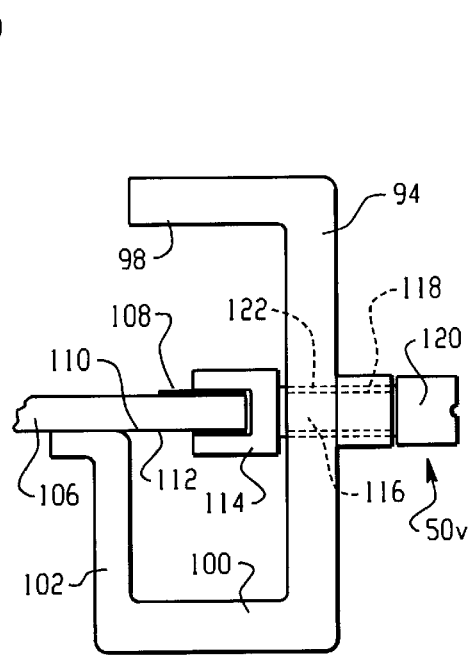
Fig. 4
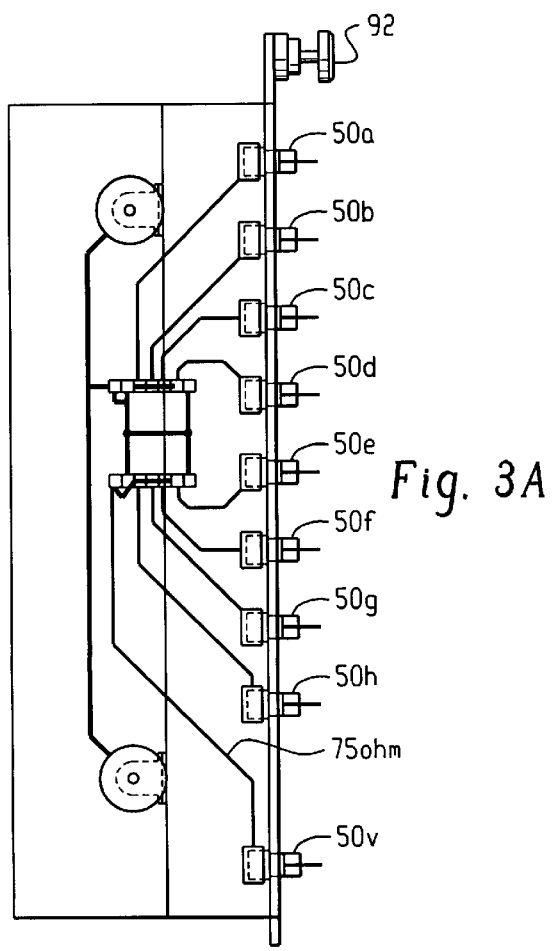
Fig. 3A
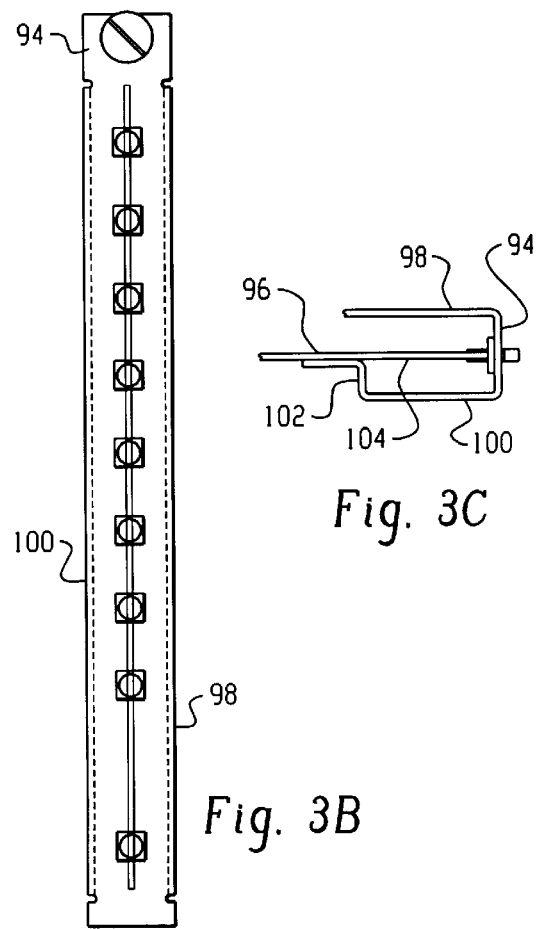
Fig. 3B
Fig. 3C

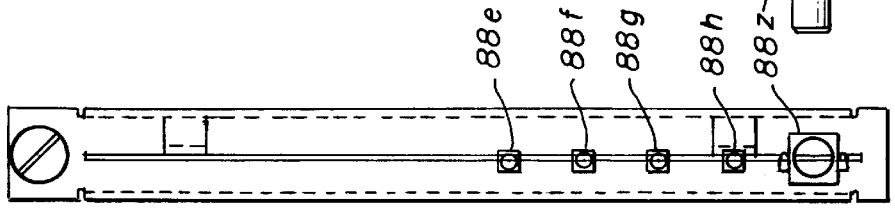
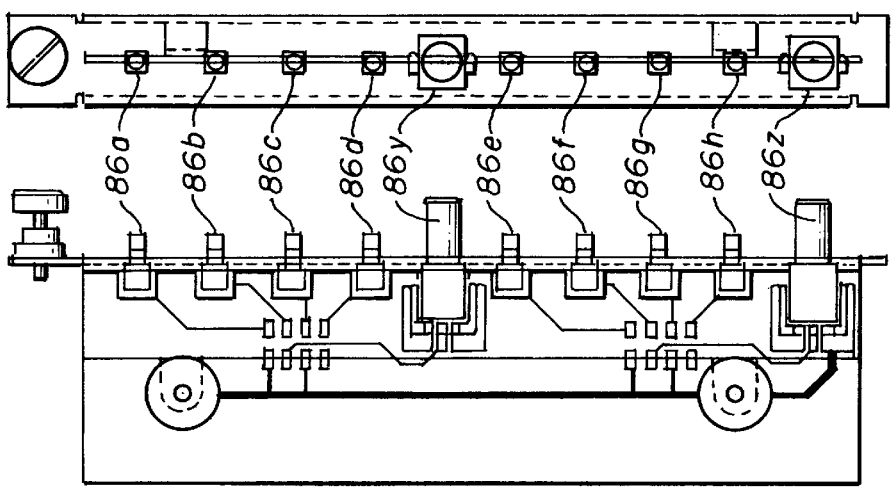
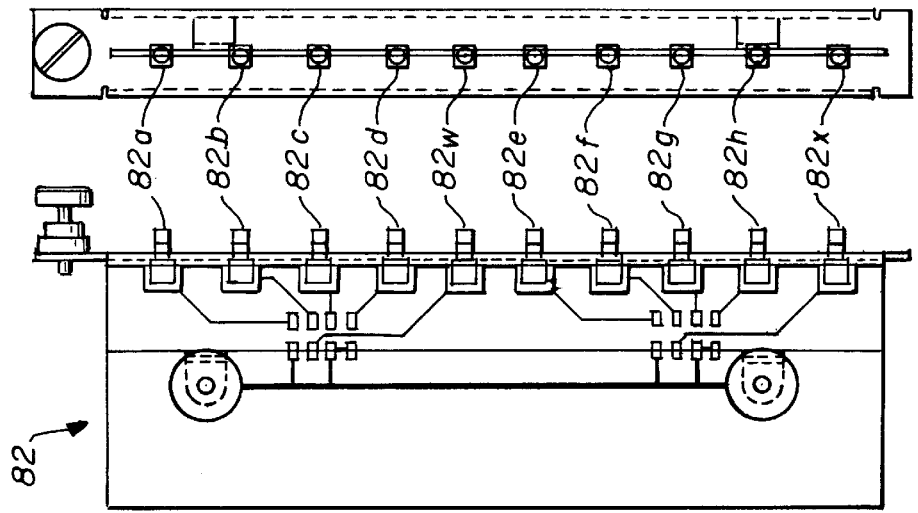
FIG. 5A    FIG. 5B    FIG. 6A    FIG. 6B    FIG. 6C    FIG. 7

DENSELY ARRANGED ELECTRICALLY SHIELDED COMMUNICATION PANELS

CROSS-REFERENCES TO RELATED APPLICATIONS

This application claims priority from the following application: U.S. application Ser. No.: 60/135,623, filed May 24, 1999.

BACKGROUND OF THE INVENTION

Field of the Invention

This invention relates to communication distribution equipment, and more specifically to methods and apparatus for supporting a multiplicity of densely arranged or packed electrical shielded communication panels, each of which has a ground or conductive sheet covering the back side of the panel to provide back side shielding to the circuitry on that same panel as well as front side shielding to an adjacent panel.

SUMMARY OF THE INVENTION

The present invention includes apparatus and methods for supporting a multiplicity of densely-arranged and electrically-shielded panels. The apparatus and methods include a distribution structure, which has a rack or panel area for supporting at least two and, in a preferred embodiment, up to 20 adjacent panels at one level of the distribution cabinet. The cabinet itself will include a grounding or electrical connection point to which all of the panels are connected by a low resistance path. To achieve the shielding provided by the apparatus of this invention, there are included at least two similar panels carrying electrical signals which are supported adjacent and in close alignment to each other by the support rack. Each of the two panels comprises a face plate for securing the panels to the rack and in a preferred embodiment includes cable connectors to terminals for providing a plurality of input communication signals and a single output communication signal made up of the combined input signals. Each of the panels will include a printed circuit board which extends perpendicularly away from the face plate and which is made up of an insulating substrate having a circuit side and a back side. The circuit side includes a printed circuit, which is printed on the substrate by well-known printed circuit techniques. And the back side includes a conducted sheet or ground which is printed or otherwise secured to and substantially covers the back side of the substrate. A low-resistance conductive path exists between the conductive sheet on the circuit board and the electrical connection point of the rack or distribution cabinet such that each panel includes a low-resistance path between the conductive sheet and the connection point (normally ground) on the rack. As mentioned above, the connection point on rack is usually a grounding point such that all of the conductive sheets on each of the panels are at ground potential.

The adjacent panels are closely aligned and supported in the support rack so that the printed circuit of one of the panels is electrically shielded on its back side by the conductive sheet on that same panel and on its circuit or front side by the conductive sheet of the adjacent panel. According to a preferred embodiment, each of the panels is a panel for combining RF communication electrical signals which operate over a bandwidth at a selected center frequency. The printed circuit is simple and straightforward in that it provides electrical combination of incoming signals to a single output connector, such that a combination of signals is provided at the single output terminal. Also in a preferred embodiment, the printed circuit paths will be selected such that there is a constant resistence such as 75 ohms between each of the input terminals and the single output terminal. As will be appreciated by those skilled in the art, a path resistance of 75 ohms is standard for coaxial cable since the loss in the cable is at a minimum at that impedance. When sending high-speed signals, it is preferred that the transmission line impedance be maintained the same over the signal path. Maintaining the same impedance enables the maximum power transfer.

BRIEF DESCRIPTION OF THE DRAWINGS

These and other features of the present invention will be more fully disclosed when taken in conjunction with the following Detailed Description of the invention which like numerals represent like elements and in which:

FIG. 1. is a diagrammatic representation of a support structure or cabinet having at least one panel area, or rack with dimensions suitable for supporting densely-aligned panels of the present invention. Other panel areas or racks of the support structure or cabinet may include power supplies, light-emitting generators, cooling fans, and the like;

FIGS. 3a, 3b, and 3c are a side view, front view, and bottom view respectively of one embodiment of electrically-shielded panels of the present invention suitable for being densely arranged with similar type panels;

FIG. 4 is a highly enlarged and detailed view of the FIG. 3c bottom view for illustrating details of the panel;

FIGS. 5a and 5b show still another embodiment of the shielded panels of the present invention;

FIGS. 6a, 6b and 6c show yet another embodiment of a panel of the present invention suitable for being densely arranged with like panels; and FIG. 7 is another bottom view of the different type connector terminals used on the electrically-shielded panels of the present invention.

DETAILED DESCRIPTION OF THE INVENTION

Figure 2:
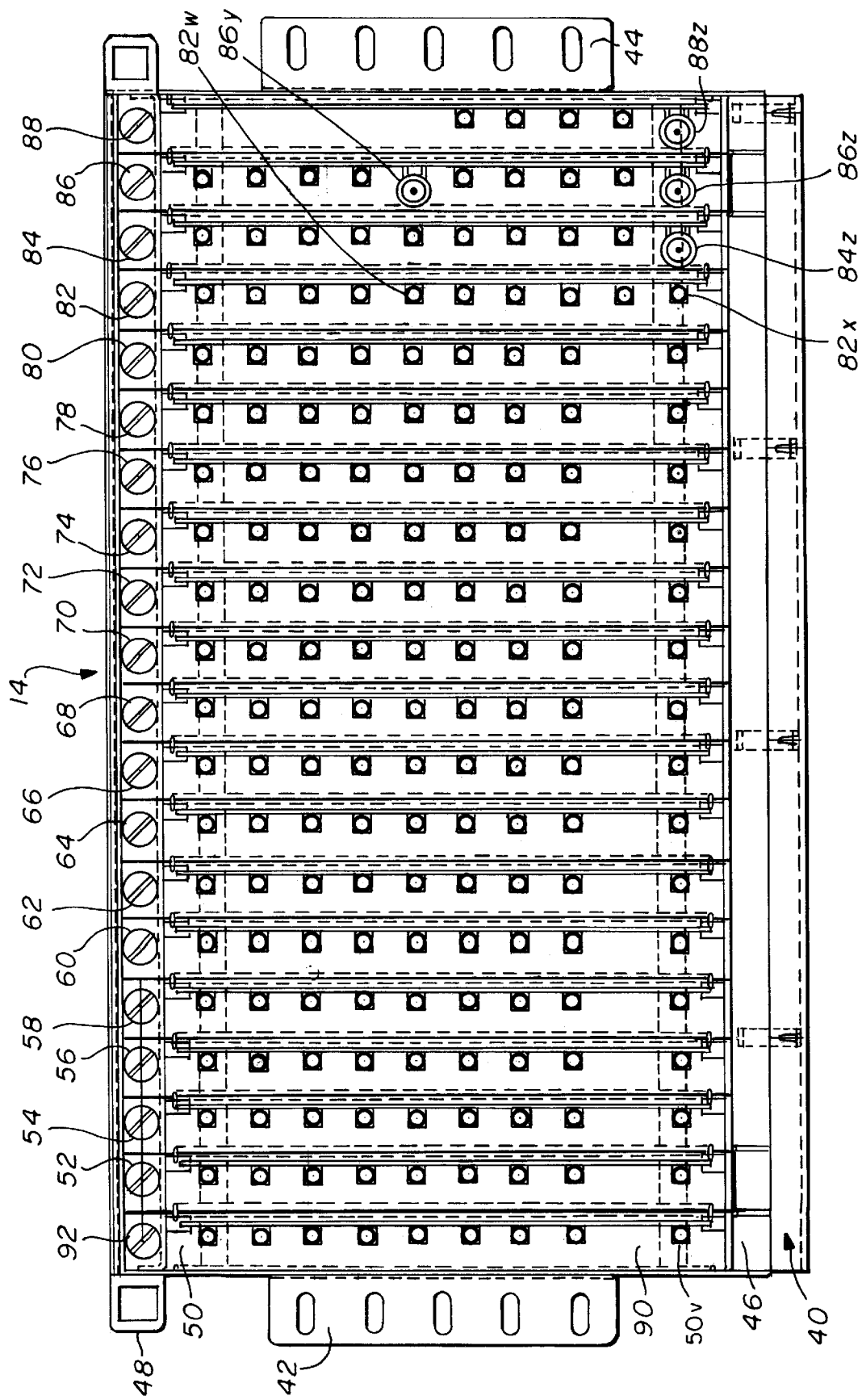
FIG. 2 shows the panel area of FIG. 1, which receives the densely-aligned shielded panels of the present invention.

Referring now to FIG. 1, there is shown a support structure or cabinet 10, which in the embodiment shown, has at least one rack area 12 as well as second and third panel or rack areas 16 and 18. It should be appreciated that the distribution within the structure or cabinet 10 may well include other areas for different panels, including other areas for panels of the present invention, such as panel or rack area 12. However, for explanation purposes only, there is shown one panel or rack area 12, a panel or rack area 16 with a power supply 20 and four optical transmitters 22–28 for generating light at specific wavelengths of light commonly referred to as λ. The panel or rack area 18 typically might include a cooling fan 30 as well as four other additional optical-transmitting devices 32–38 for generating wavelengths of light still different from those of panels 22, 24, 26, and 28 above. Cabinet 10 includes an electrical connection point 11 which typically is connected to ground.

Referring now to FIG. 2, there is shown a group of panels 14 located in panel or rack area 12 supported by the cabinet structure 10. Typically, the panel or rack area 12 will include a rack or support pocket 40, which will typically be a box-like structure supported in the cabinet 10 by support brackets 42 and 44. The receiving rack 40 will include at least a bottom support member 46 and a top support member 48. In the embodiment shown, there are 20 densely-aligned and arranged connection panels 50 through 88. Also in the embodiment shown, there is a front portion or face plate on each of the panels, such as front portion or face plate 90 on panel 50. Each front portion or face plate includes a mounting screw or lug 92 received by support bracket 48. Also as shown in FIG. 2, it is seen that panels 50 through 80 have eight input terminals in one group and a single output terminal at the bottom of the rack. As will be discussed later, the eight top terminals 50a through 50h are for receiving up to eight different input signals which may have the same or different frequencies, which signals are then combined and provided as a single output on the bottom output terminal 50. Panels 82 through 88, on the other hand, are dual combining circuits. That is, there are two combining circuits on each panel. The panels illustrated in FIG. 2 show four different types of dual panels.

As shown, panel 82 includes 10 connectors of the same type. The first four top connectors are input terminals, as discussed above. The next terminal, however, indicated in the drawing as 82w, is a first output terminal providing a combined output to the signals received from the four top connectors. In a similar manner, the next four terminals are the input terminals for the second combining circuit on panel 82, and terminal 82x is the output terminal for the combined signals received from the bottom four input terminals.

Panel 84 is almost identical to panel 82, except the lower-most output terminal 84z is larger than terminal 82x and is for connecting to a larger connection terminal on heavy-duty coaxial cables. Panel 86 is similar to panel 84, except the output terminal 86y is also a large output terminal of the same type as 84z. This larger connection terminal is often referred to as an "F" connector. It is also noted that the panel 88 does not include the top four input terminals or the top output terminals, as did panels 82, 84, and 86. In some instances, the circuits may be on the printed circuit board and just not brought to the front of the panel or in other instances, the circuit boards may be manufactured without these second circuits.

Referring now to FIGS. 3a, 3b, and 3c, there is shown a side view, a front view and a bottom view of the panel 50, which, of course, is also similar to the panels 52 and 80. These views clearly show the connecting lug 92 which is attached to the face plate or front portion 94 of panel 50. As shown more clearly in FIG. 3C, a printed circuit board 96 extends perpendicularly to the face plate or front portion 94 of panel 50. The face plate or front portion 94 of the panel includes a first edge member 98 for support and a second support member 100, which it will be noticed also includes an extension 102 which abuts the conductive sheet 112 on the backside 104 of the printed circuit board 96. Although it will be appreciated that various and different types of circuit boards may benefit from the teachings of the present invention, according to one embodiment the circuit board is used for combining electrical RF signals, each having a bandwidth around a different center frequency. The printed circuit board will include on connection path from each of the input terminals 50a through 50h such that each of these terminals provides a constant input impedance, such as, for example, 75 ohms. A single printed connection path will run from the common connection point of the output terminal 50v, and would also provide a constant impedance from the connection point to the output terminal. Referring now to FIG. 4, there is shown a highly-enlarged view of the bottom view FIG. 3c. As shown, the printed circuit board 96 will include an insulating substrate 106, having a front side with a printed circuit thereon. In the portion of the circuit board shown in FIG. 4, part of the printed circuit is shown as section 108. The printed circuit will also include on the back side 110 of the substrate 106 a conductive sheet 112, which is substantially co-extensive with the overall size of the printed circuit board. As will be appreciated by those skilled in the art, the conductive sheet 112 will typically act as a grounding plane to provide electrical shielding. Also as shown, the extension 102 of front portion 94 of panel 50 is in electrical contact with the conductive sheet 112.

Also as shown in the figures, and more clearly in FIG. 4, the connection terminals 50a through 50h and 50v include a rear portion 114; a throat portion 116 and an outward securing portion 118 which may be unitary with the cable-receiving portion 120. This type terminal is shown such that the throat portion 116 extends through an aperture 122 in front panel 94 to which is then attached the outward portion 118. As shown, of course, the diameter of portions 114 and 118 are larger than the aperture at 122 such that the 5 terminal may be secured tightly to the faceplate 94. This may be accomplished by tightening the outward portion 118 on threads cut into the portion 116. This type of terminal may be referred to as an edge terminal, as it makes an electrical connection to the edges of conductive plate 112 and circuit portion 108 without requiring soldering or other permanent attachments. For example, the printed circuit portion 108 and the conductive sheet 112 are in a tight frictional electrical contact with conductors 116 and 118 respectively on the internal portion of the terminal 114.

Referring now to FIGS. 5a and 5b, there is shown a side view and front view of the dual combination panel 82. As can readily be seen, this panel includes a first portion or combination circuit which has input terminals 82a through 82d, which provide their inputs to a single output terminal 82w and a second circuit, which includes inputs 82e through 82h, which have their inputs combined and provided on a single output 82x.

Referring now to FIGS. 6a and 6b, there is shown a panel design similar to that of panel 86. It will be appreciated from FIGS. 6a and 6b, along with FIG. 5a, that panel 86 is substantially similar as the panel shown in FIG. 5a, except it includes two heavy-duty connectors 86y and 86z. Although there is no illustration shown for panel 84, it will substantially similar to the dual circuitry with respect to FIG. 5a except it will include one small connector, such as connector 82x and one large output connector such as 86z.

Finally, FIG. 6c shows a front portion suitable for use with the dual circuit of FIG. 6a where the first portion of the circuit, having inputs 88a through 88d and output 82x are not brought out to the front panel. Again, as mentioned above, the circuitry portion used by the input terminals 88a through 88d and output terminal 86y may either be provided and not brought to the front of the panel, or simply not printed onto the circuit board.

FIG. 7 shows the bottom view of the panel such as shown in FIGS. 6a, 6b, and 6c.

The corresponding structures, materials, acts, and equivalents of all means or steps, plus function elements in the claims below, are intended to include any structure, material, or act for performing the function in combination with other claimed elements as specifically claimed.

What is claimed is:

1. An apparatus for supporting a multiplicity of densely-arranged and electrically-shielded panels comprising:

a distribution rack having a structure for supporting at least two adjacent panels, said rack including an electrical connection point;

at least two panels carrying electrical signals supported adjacent and in close alignment to each other by said rack, each of said at least two panels comprising:

a face plate for securing said panels to said rack;

a printed circuit board extending perpendicularly away from said face plate, said printed circuit board including an insulating substrate having a circuit side and a back side, a printed circuit on said circuit side of said insulating substrate, and a conductive sheet secured to and substantially covering said back side of said substrate;

a low resistance conductive path between said conductive sheet and said electrical connection point on said rack; and said adjacent and closely aligned at least two panels supported in an arrangement by said rack such that the printed circuit of one of said panels is electrically shielded on its back side by the conductive sheet on that same panel and on its circuit side by the conductive sheet of the adjacent panel.

2. The apparatus of claim 1 wherein the face plate of each of said panels has a long dimension and a short dimension and said panels are supported in said distribution rack such that said long dimension extends vertically and said short dimension extends horizontally across said rack.

3. The apparatus of claim 1 wherein said multiplicity of densely arranged and electrically shielded panels comprises at least twenty such panels.

4. The apparatus of claim 1 wherein said face plate further comprises a plurality of connectors for receiving cables carrying electrical signals.

5. The apparatus of claim 4 wherein said plurality of connectors comprises connectors for receiving cables for carrying an input signal and at least one connector for receiving a cable for carrying an output signal.

6. The apparatus of claim 5 wherein there are eight connectors on said face plate for input signals and one connector for an output signal.

7. The apparatus of claim 5 wherein there are four connectors on said face plate for input signals and one connector for an output signal.

8. The apparatus of claim 5 wherein there are two connector circuits and each circuit includes four connectors on said face plate for input signals and one connector for an output signal.

9. The apparatus of claim 5 wherein said printed circuits provide a constant impedance pathway between said connectors for said input signals and said connector for said output signal.

10. A method for supporting and shielding a multiplicity of densely arranged electrical panels comprising the steps of:

providing an electrical connection point in a distribution rack;

supporting at least two adjacent panels in said distribution rack in close alignment to each other each of said panels having a face plate;

securing said face plate of each of said at least two adjacent panels to said rack for each of said at least two adjacent panels;

attaching a printed circuit board having an insulated substrate with a circuit side and a back side to said face plate so said circuit board extends perpendicular away from said face plate;

providing a printed circuit on said circuit side of said insulating substrate;

covering said back side of said insulating substrate with a conductive sheet; and providing a low resistance conductive path between said conductive sheet and said electrical connection point on said distribution rack of each of said at least two adjacent panels such that each the printed circuit on one of said panels is electrically shielded on its back side by the conductive sheet on that same panel and on its circuit side by the conductive sheet of the adjacent panel of the another one of said at least two adjacent panels.

* * * * *